United States Patent
Mori

(10) Patent No.: US 7,403,042 B2
(45) Date of Patent: Jul. 22, 2008

(54) FLIP-FLOP, INTEGRATED CIRCUIT, AND FLIP-FLOP RESETTING METHOD

(75) Inventor: Makoto Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 95 days.

(21) Appl. No.: 11/374,183

(22) Filed: Mar. 14, 2006

(65) Prior Publication Data

US 2007/0146031 A1 Jun. 28, 2007

(30) Foreign Application Priority Data

Dec. 28, 2005 (JP) ............................. 2005-377807

(51) Int. Cl.
*H03K 19/096* (2006.01)
(52) U.S. Cl. .............................. 326/95; 326/33; 326/98
(58) Field of Classification Search .................. 326/31, 326/33, 99–94; 327/142–143, 198
See application file for complete search history.

(56) References Cited

U.S. PATENT DOCUMENTS 5,821,787 A * 10/1998 McClintock et al. ........ 327/143
6,728,158 B2 * 4/2004 Takahashi et al. ......... 365/225.7
2003/0147287 A1 * 8/2003 Lee ....................... 365/189.09

FOREIGN PATENT DOCUMENTS

JP 02-100413 4/1990

* cited by examiner

*Primary Examiner*—Anh Q Tran
(74) *Attorney, Agent, or Firm*—Staas & Halsey LLP

(57) ABSTRACT

A flip-flop which eliminates a reset wiring to prevent complication of a wiring in an LSI or to increase the number of channels used for a signal wiring, an integrated circuit using the same, and a flip-flop resetting method, are provided. The flip-flop performing a reset operation by detecting a change in a power supply voltage includes a state retaining node that stores a HIGH level voltage or a LOW level voltage, and a reset signal generation circuit that detects a change in a power supply voltage exceeding a predetermined value to generate a reset signal for resetting a data storing state of the state retaining node.

4 Claims, 5 Drawing Sheets

1 PULL-UP GENERATION CIRCUIT
2 STATE RETAINING NODE (RESET SIGNAL GENERATION CIRCUIT) FF

1 PULL-DOWN GENERATION CIRCUIT
2 STATE RETAINING NODE

FLIP-FLOP, INTEGRATED CIRCUIT, AND FLIP-FLOP RESETTING METHOD

BACKGROUND OF THE INVENTION

1. Field of the Invention

This invention relates to a flip-flop, an integrated circuit using the same, and a flip-flop resetting method capable of resetting a flip-flop (hereinafter referred to as FF) by changing a power supply voltage.

2. Description of the Related Art

Conventionally, there are known a variety of techniques of resetting an FF. For example, as an integrated circuit capable of initializing an FF included therein, there is known an integrated circuit including: a selection signal sending section that sends a selection signal for a predetermined time period after power-on of the integrated circuit; a first selection section that sends a logic signal of a certain level to a master set terminal when the selection signal is sent, and sends an original logic signal to the master set terminal when the selection signal is not sent; and a second selection section that sends a logic signal having an inverse value of the logic signal of the certain level to the master set terminal when the selection signal is sent, and sends the original logic signal to the master set terminal when the selection signal is not sent. (refer to Patent Document 1: Jpn. Pat. Appln. Laid-Open Publication No. 2-100413).

As described above, the conventional FF is designed to reset its data. As described above, however, to reset the data of the FF, it is necessary to provide a reset terminal in the FF for distributing a reset signal in an integrated circuit (e.g., an LSI), for example. Therefore, a wiring in the LSI is complicated. Further, space for wiring a reset signal line is required, and thus there is a limit in adding other signal wirings. As a result, it becomes difficult to increase the number of channels used for a signal wiring.

SUMMARY OF THE INVENTION

The present invention is made to solve the above described problems, and it is therefore an object of the present invention to provide a flip-flop which eliminates a reset wiring to prevent complication of the wiring in the LSI or to increase the number of the channels used for a signal wiring, an integrated circuit using the same, and a flip-flop resetting method.

To solve the above described problems, in the present invention, a power supply wiring already distributed in the LSI is used also as a wiring for performing a reset operation so that the reset signal of the FF is generated by changing the power supply voltage.

That is, according to one aspect of the present invention, a flip-flop performs a reset operation by detecting a change in a power supply voltage. The flip-flop includes a state retaining node that stores a HIGH level voltage or a LOW level voltage, and a reset signal generation circuit that detects a change in a power supply voltage exceeding a predetermined value to generate a reset signal for resetting a data storing state of the state retaining node.

In the flip-flop, the reset signal generation circuit is provided for the individual state retaining node.

Further, in the flip-flop, the reset signal generation circuit is provided for a plurality of the state retaining nodes.

According to another aspect of the present invention, an integrated circuit includes a flip-flop. The flip-flop includes a state retaining node that stores a HIGH level voltage or a LOW level voltage, and a reset signal generation circuit that detects a change in a power supply voltage exceeding a predetermined value to generate a reset signal for resetting a data storing state of the state retaining node.

In the integrated circuit, the reset signal generation circuit is provided for the individual state retaining node.

Further, in the integrated circuit, the reset signal generation circuit is provided for a plurality of the state retaining nodes.

Further, in the integrated circuit, the flip-flop is provided by a plural number, and the plurality of the flip-flops are divided into a plurality of groups such that different power supply voltages are separately introduced to the respective groups.

Further, the integrated circuit further includes a power supply circuit capable of changing the power supply voltage.

Further, in the integrated circuit, the power supply voltages can be separately changed.

Further, the integrated circuit further includes a reset logic circuit for changing the power supply voltage output by the power supply circuit in accordance with a signal sent by an operation system or a predetermined hardware.

According to still another aspect of the present invention, a flip-flop resetting method is used for performing a reset operation by detecting a change in a power supply voltage. The flip-flop resetting method includes the steps of: detecting a change in a power supply voltage exceeding a predetermined value; generating a reset signal for resetting a data storing state of a state retaining node of a flip-flop; and resetting the flip-flop in accordance with the reset signal.

The present invention can provide a flip-flop which eliminates a. reset wiring to prevent complication of the wiring in the LSI or to increase the number of the channels used for a signal wiring, an integrated circuit using the same, and a flip-flop resetting method.

DETAILED DESCRIPTION OF THE PREFERRED EMBODIMENTS

Embodiments of the present invention will be described below by referring to the accompanying drawings.

First Embodiment

Figure 1:
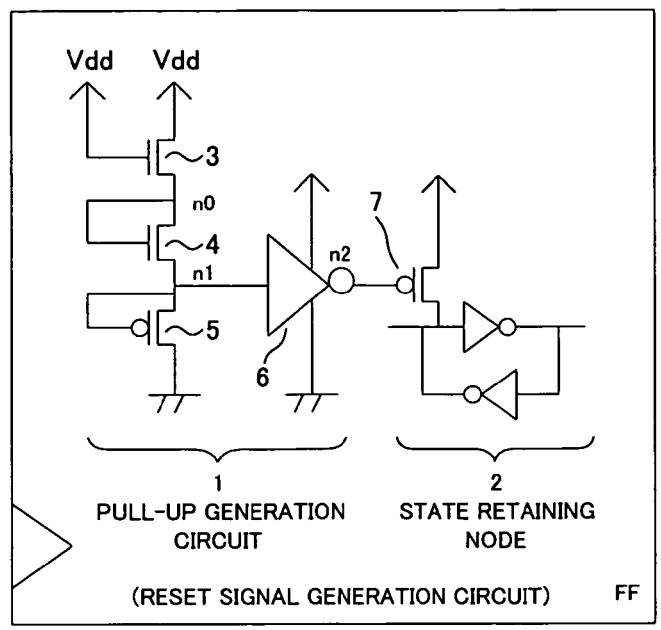
FIG. 1 is a circuit diagram of an FF according to a first embodiment of the present invention.

FIG. 1 is a circuit diagram of an FF according to a first embodiment of the present invention. The FF shown in FIG. 1 is provided in an integrated circuit, and includes a pull-up generation circuit (i.e., a reset signal generation circuit) 1 that generates a reset signal and a state retaining node 2 that stores a HIGH level voltage or a LOW level voltage as data. In the pull-up generation circuit 1, two NFETs 3 and 4 and a PFET 5 are connected in cascade to one another between a power supply (Vdd) and the ground, and an inverter 6 is connected between the NFET 4 and the PFET 5. An output terminal of the inverter 6 (i.e., a node n2) is connected to a reset terminal 7 of the state retaining node 2. The reset terminal 7 of the state retaining node 2 is formed by the gate of a PFET. In the present embodiment, the number of NFET stages is two (i.e., NFETs 3 and 4). In some cases, however, the number of NFET stages may be one or three or more, depending on Vth of NFETs.

Figure 2A:
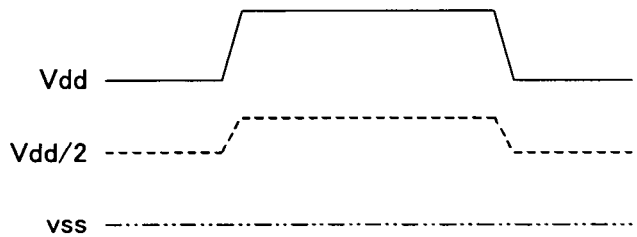
FIGS. 2A to 2C are time charts illustrating operations according to the first embodiment of the present invention.
Figure 2B:
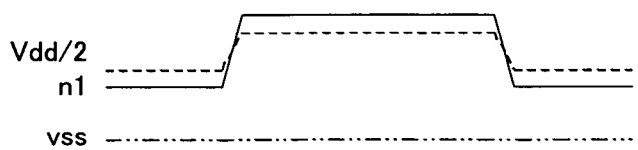
Figure 2C:

In the configuration described above, if a usually used power supply voltage is 1.0 volts, for example, a content of the FF (i.e., data retained by the state retaining node 2) can be reset to 0 by changing the power supply voltage from 1.0 volts to 1.8 volts and then to 1.0 volts. Operations according to the first embodiment will be described in detail below by referring to FIGS. 2A to 2C. FIG. 2A represents a relationship between Vdd, Vdd/2, and a ground voltage vss. FIG. 2B represents a relationship between Vdd/2 and a voltage (i.e., electric potential) at a node n1. FIG. 2C represents a relationship between a voltage (i.e., electric potential) at the node n2 and the ground voltage vss.

If the power supply voltage is Vdd, a voltage at a node n0 (i.e., a point between the NFETs 3 and 4) is expressed as Vdd−Vth, since the node n0 is connected to the power supply by the NFET 3. Similarly, a voltage at the node n1 (i.e., a point between the NFET 3 and the PFET 5) is expressed as Vdd−2Vth. In this case, the Vth is a voltage representing a voltage drop caused by an FET, and is determined by a process.

It is now assumed that the Vth is 400 millivolts, for example. The voltage at the node n1 is always lower than the power supply voltage by 800 millivolts. Therefore, if the power supply voltage is changed from 1.0 volts to 1.8 volts, as illustrated in FIG. 2A, the voltage at the node n1 changes from 0.2 volts to 1.0 volts, as illustrated in FIG. 2B.

In view of the above, if the threshold value of the next-stage inverter 6 is set to be Vdd/2, the voltage at the node n2, i.e., an output voltage of the inverter 6, changes from a HIGH level (i.e., 1.0 volts) to a LOW level (i.e., 0.0 volt), as illustrated in FIG. 2C.

Similarly, if the power supply voltage is changed from 1.8 volts to 1.0 volts, as illustrated in FIG. 2A, the voltage at the node n2 changes from the LOW level (i.e., 0.0 volt) to the HIGH level (i.e., 1.0 volts), as illustrated in FIG. 2C. In this way, as the voltage at the node n2 changes from the HIGH level to the LOW level and then to the HIGH level, the FF (i.e., the data retained by the state retaining node 2) can be reset.

Second Embodiment

Figure 3:
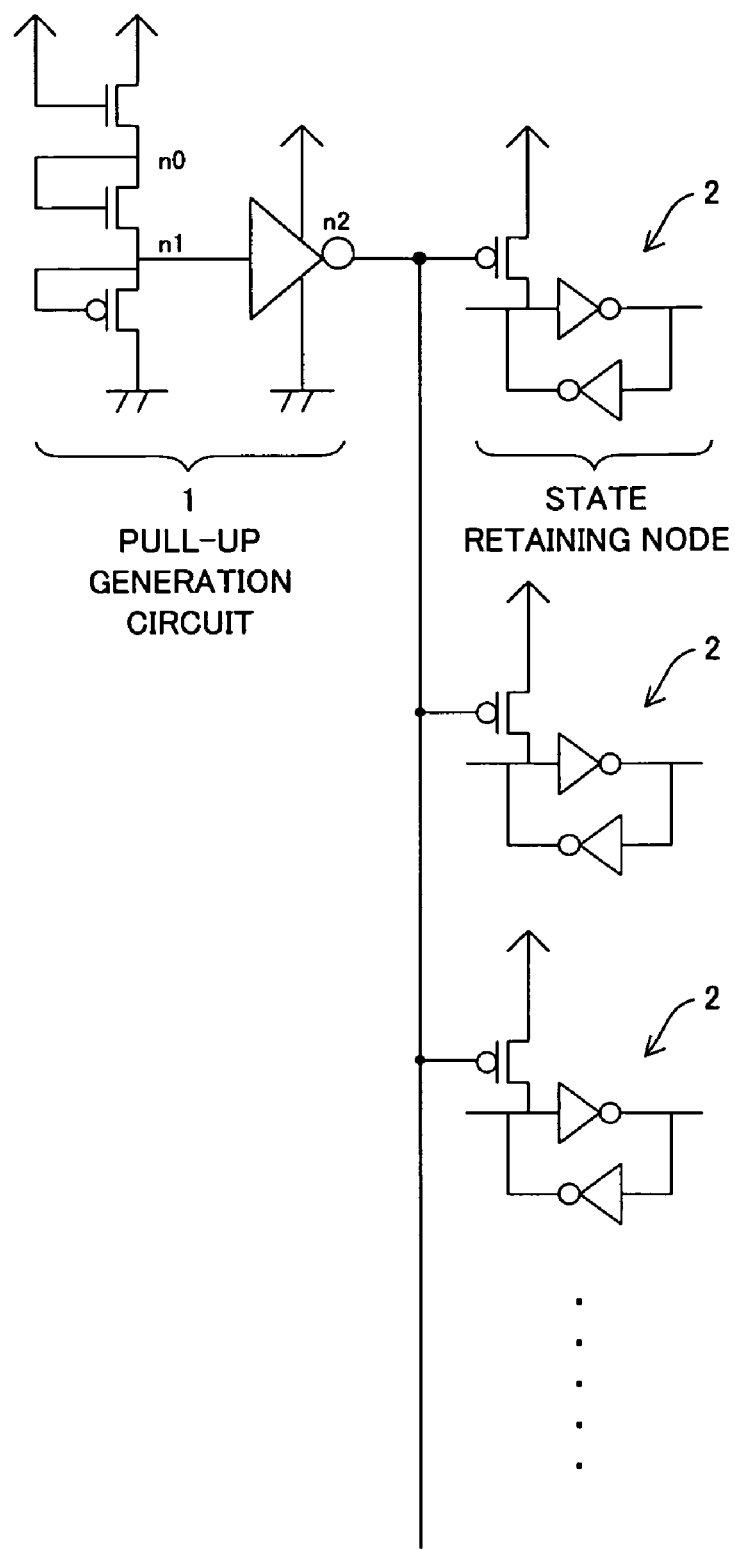
FIG. 3 is a circuit diagram of an FF according to a second embodiment of the present invention.

In the circuit configuration shown in FIG. 1, the pull-up generation circuit (i.e., the reset signal generation circuit) is included in a single FF. Alternatively, as in a second embodiment, the pull-up generation circuit 1 can be shared by a plurality of the state retaining nodes (i.e., FFs) 2, as illustrated in FIG. 3. That is, in this case, a single pull-up generation circuit 1 is provided for the plurality of the state retaining nodes 2 included in an integrated circuit. According to the second embodiment, the plurality of the state retaining nodes (i.e., FFs) 2 can be reset by the single pull-up generation circuit 1. Accordingly, the plurality of the state retaining nodes 2 can be effectively reset.

Third Embodiment

Figure 4:
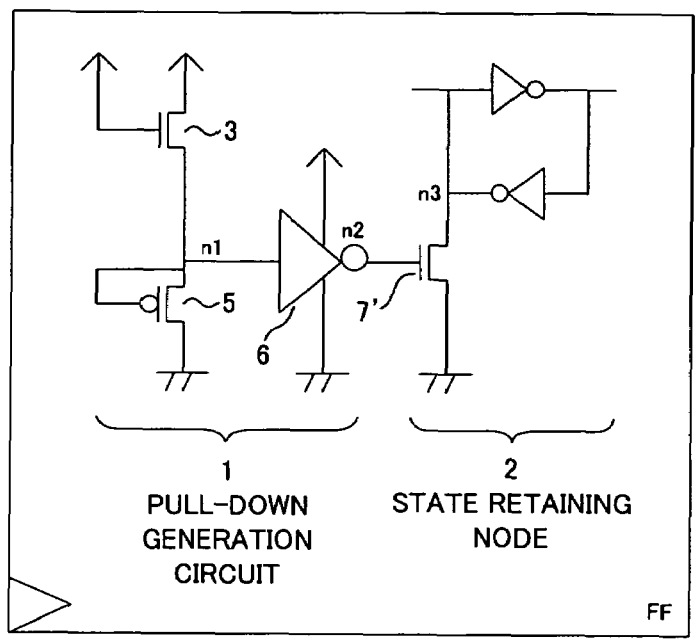
FIG. 4 is a circuit diagram of an FF according to a third embodiment of the present invention.

FIG. 4 is a circuit diagram of an FF according to a third embodiment. In the third embodiment, a pull-down generation circuit (i.e., a reset signal generation circuit) 1 includes one NFET 3 and one PFET 5. A node n1 connecting the NFET 3 and the PFET 5 is connected to an inverter 6. A reset terminal 7' of a state retaining node 2 is formed by the gate of an NFET. In some cases, however, the number of PFET stages in the pull-down generation circuit 1 may be two or more, depending on Vth of PFETs.

Figure 5A:
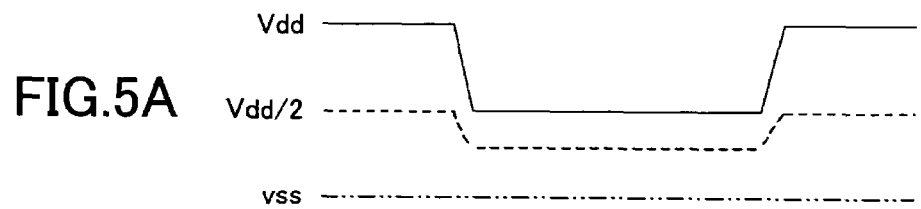
FIGS. 5A to 5C are time charts illustrating operations according to the third embodiment of the present invention.
Figure 5B:
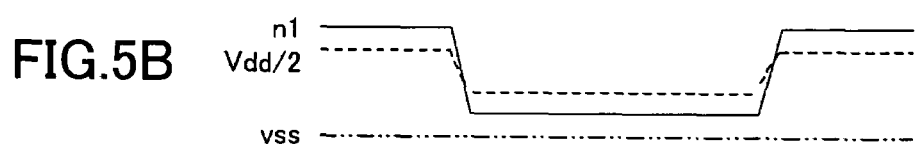
Figure 5C:
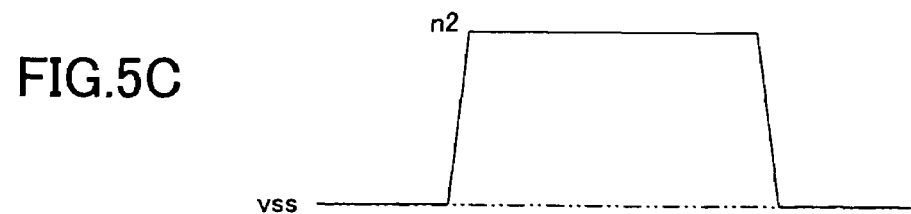

According to the third embodiment, the content of the FF can be reset to 0 by changing the power supply voltage from 1.0 volts to 0.6 volts and then to 1.0 volts. Operations according to the third embodiment will be described in detail below by referring to FIGS. 5A to 5C. FIG. 5A represents a relationship between Vdd, Vdd/2, and a ground voltage vss. FIG. 5B represents a relationship between Vdd/2 and a voltage (i.e., electric potential) at the node n1. FIG. 5C represents a relationship between a voltage (i.e., electric potential) at a node n2 and the ground voltage vss.

First, if the power supply voltage Vdd is changed from 1.0 volts to 0.6 volts, as illustrated in FIG. 5A, the voltage at the node n1 changes from 0.6 volts to 0.2 volts, as illustrated in FIG. 5B. Further, as illustrated in FIG. 5C, the voltage at the node n2 changes from the LOW level (i.e., 0.0 volt) to the HIGH level (i.e., 0.6 volts).

Similarly, if the power supply voltage is changed from 0.6 volts to 1.0 volts, as illustrated in FIG. 5A, the voltage at the node n2 changes from the HIGH level (i.e., 0.6 volts) to the LOW level (i.e., 0.0 volt), as illustrated in FIG. 5C. In this way, as the voltage at the node n2 changes from the LOW level to the HIGH level and then to the LOW level, the FF (i.e., the data retained by the state retaining node 2) can be reset.

Fourth Embodiment

Figure 6:
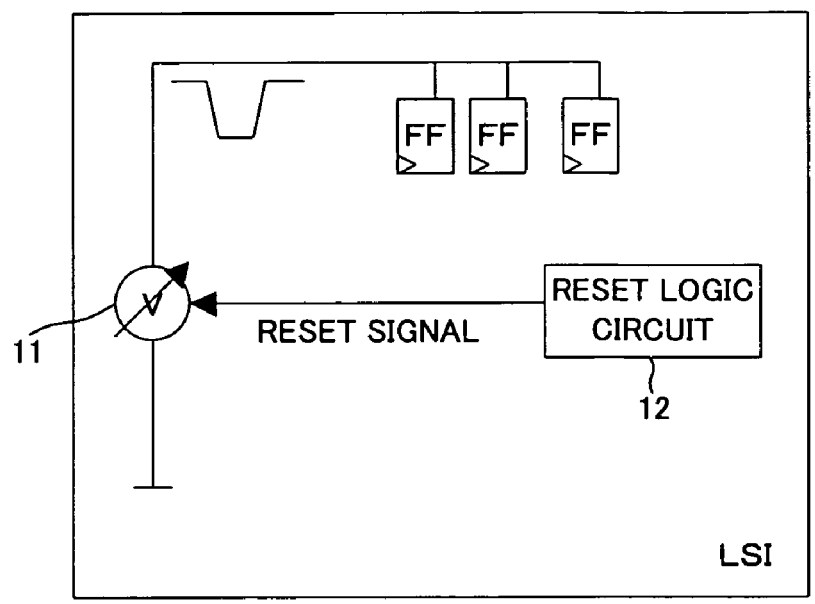
FIG. 6 is a circuit diagram of an FF according to a fourth embodiment of the present invention.

FIG. 6 is a block diagram illustrating an LSI according to a fourth embodiment. The LSI includes a plurality of the FFs described above in the first to third embodiments.

The LSI shown in FIG. 6 includes the plurality of the FFs, a power supply circuit 11 connected to the plurality of the FFs, and a reset logic circuit 12 which resets the plurality of the FFs by changing the power supply voltage of the power supply circuit 11.

A connection configuration of the power supply circuit 11 and each of the plurality of the FFs is the same as the connection configuration described above in the first to third embodiments.

Operations according to the fourth embodiment will be described below. The reset logic circuit 12 generates a reset signal in accordance with a command sent by an OS or hardware (not illustrated). Upon receipt of the reset signal, the power supply circuit 11 changes the power supply voltage. Thereby, the plurality of the FFs (i.e., an FF group) connected to the power supply circuit 11 are reset.

Fifth Embodiment

Figure 7:
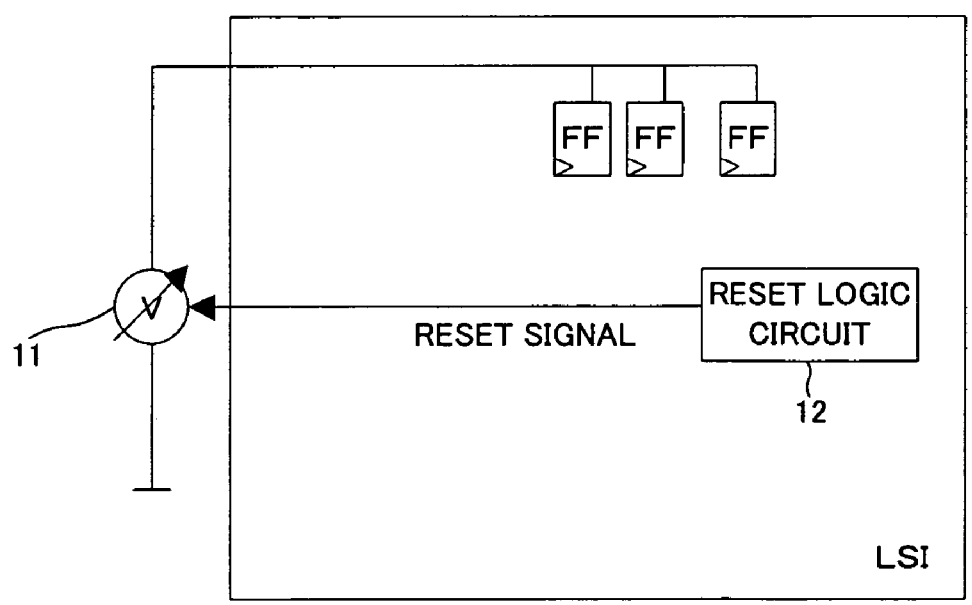
FIG. 7 is a circuit diagram of an FF according to a fifth embodiment of the present invention.

FIG. 7 illustrates an LSI according to a fifth embodiment. While the power supply circuit 11 is included in the LSI according of the fourth embodiment, the power supply circuit 11 is provided outside the LSI according to the fifth embodiment.

Sixth Embodiment

Figure 8:
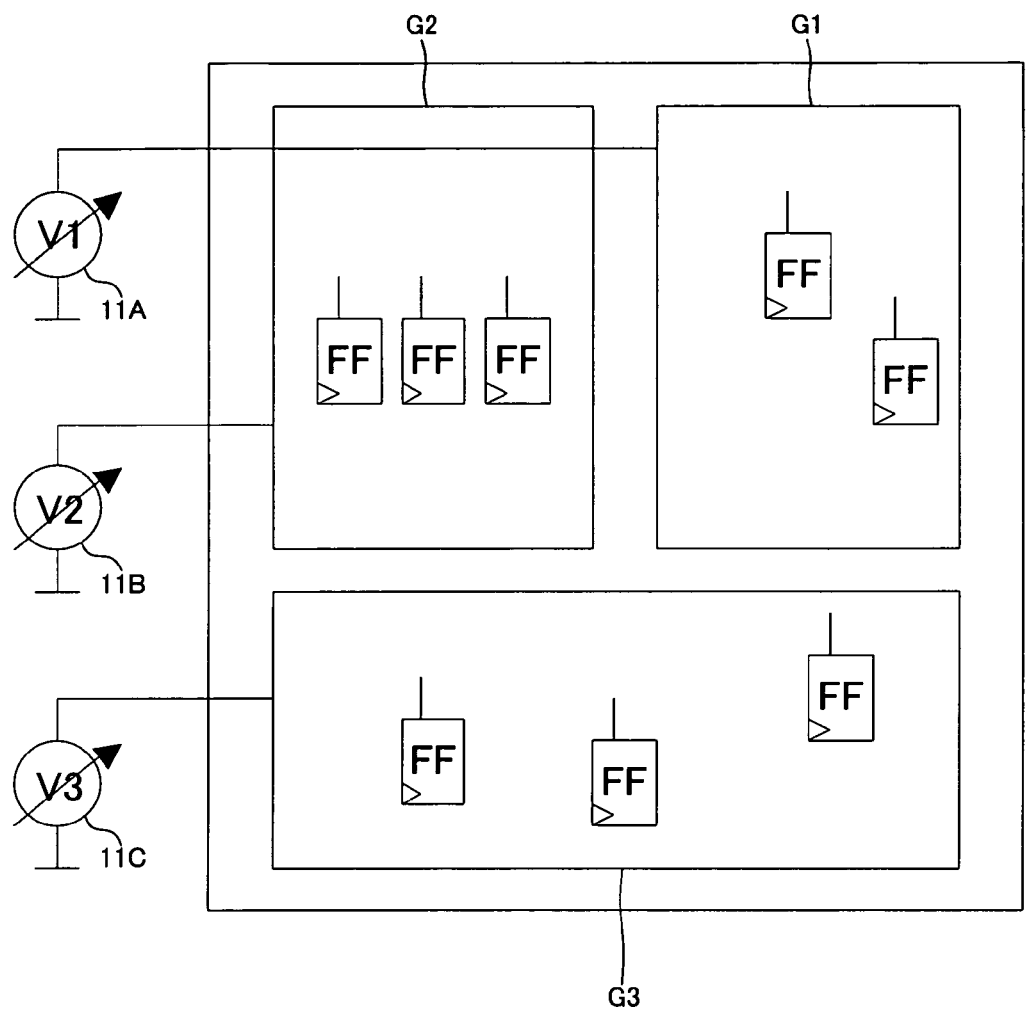
FIG. 8 is a circuit diagram of an FF according to a sixth embodiment of the present invention.

FIG. 8 is a block diagram illustrating an LSI according to a sixth embodiment. According of the sixth embodiment, the LSI includes a plurality of the FFs. The plurality of the FFs are divided into three groups G1 to G3, and wiring is designed to introduce power supply voltages V1 to V3 output by different power supply circuits 11A to 11C into the respective groups G1 to G3.

That is, FIG. 8 illustrates a configuration in which a plurality of the FFs are divided into the groups each including those FFs desired to be reset at one time. Accordingly, the FFs included in one group can be reset at one time independently from the FFs included in the other groups. In this case, the pull-up generation circuit may be shared by the state retaining nodes of the respective FFs, as illustrated in FIG. 3, or the pull-up generation circuit may be provided for the state retaining node of the individual FF, as illustrated in FIG. 1.

Accordingly, to reset the FFs of the FF group G1 connected to the power supply circuit 11A, only the power supply voltage V1 of the power supply circuit 11A is changed. Similarly, to reset the FFs of the FF group G2 connected to the power supply circuit 11B, the power supply voltage V2 of the power supply circuit 11B is changed. Further, to reset the FFs of the FF group G3 connected to the power supply circuit 11C, the power supply voltage V3 of the power supply circuit 11C is changed.

According to the embodiments of the present invention, by using an existing independent power supply wiring or a newly divided wiring, an arbitrary group of FFs can be reset with no need to distribute a reset signal.

What is claimed is:

1. An integrated circuit having a flip-flop, wherein the flip-flop comprising:
   a state retaining node that stores a HIGH level voltage or a LOW level voltage; and
   a reset signal generation circuit that detects a change in a power supply voltage exceeding a predetermined value to generate a reset signal for resetting a data storing state of the state retaining node
   wherein the flip-flop is provided by a plural number, and the plurality of the flip-flops are divided into a plurality of groups such that different power supply voltages are separately introduced to the respective groups.

2. The integrated circuit according to claim 1, wherein the power supply voltages can be separately changed.

3. An integrated circuit having a flip-flop, wherein the flip-flop comprising:
   a state retaining node that stores a HIGH level voltage or a LOW level voltage;
   a reset signal generation circuit that detects a change in a power supply voltage exceeding a predetermined value to generate a reset signal for resetting a data storing state of the state retaining node;
   a power supply circuit capable of changing the power supply voltage; and
   a reset logic circuit that changes the power supply voltage output by the power supply circuit in accordance with a signal sent by an operation system or a predetermined hardware.

4. An integrated circuit having a flip-flop, wherein the flip-flop comprising:
   a state retaining node that stores a HIGH level voltage or a LOW level voltage;
   a reset signal generation circuit that detects a change in a power supply voltage exceeding a predetermined value to generate a reset signal for resetting a data storing state of the state retaining node; and
   a reset logic circuit that changes the power supply voltage output by the power supply circuit in accordance with a signal sent by an operation system or a predetermined hardware.

* * * * *